United States Patent [19]
Grieco

[11] Patent Number: 4,492,933
[45] Date of Patent: Jan. 8, 1985

[54] TEMPERATURE COMPENSATION CIRCUIT FOR OSCILLATOR WITH PARABOLIC CHARACTERISTIC

[75] Inventor: Steven E. Grieco, Mt. Prospect, Ill.
[73] Assignee: Motorola, Inc., Schaumburg, Ill.
[21] Appl. No.: 402,511
[22] Filed: Jul. 28, 1982
[51] Int. Cl.³ ............................................. H03L 1/02
[52] U.S. Cl. ................................. 331/66; 310/315; 328/3; 331/176
[58] Field of Search ................. 331/66, 176; 310/315; 328/3

[56] References Cited

U.S. PATENT DOCUMENTS

| | | | |
|---|---|---|---|
| 3,492,586 | 1/1970 | Leffmann | 328/3 |
| 3,821,665 | 6/1974 | Irwin et al. | 331/116 |
| 4,297,657 | 10/1981 | Frerking | 331/176 |
| 4,380,745 | 4/1983 | Barlow et al. | 331/176 |
| 4,412,188 | 10/1983 | Helle et al. | 331/176 |

Primary Examiner—Eugene R. LaRoche
Assistant Examiner—D. C. Mis
Attorney, Agent, or Firm—Donald B. Southard; Edward M. Roney; James W. Gillman

[57] ABSTRACT

An improved temperature compensation circuit for an oscillator circuit having a frequency response that is parabolic with respect to temperature, including a time dependent ramp signal, an AC integrator for converting the ramp signal to single-sided parabolic voltage functions and means for sampling the resulting time dependent one-sided parabolic voltage functions with respect to a time base at selected times corresponding to ambient temperatures.

10 Claims, 7 Drawing Figures

— FREQUENCY VS. TEMPERATURE
--- VOLTAGE VS. TEMPERATURE

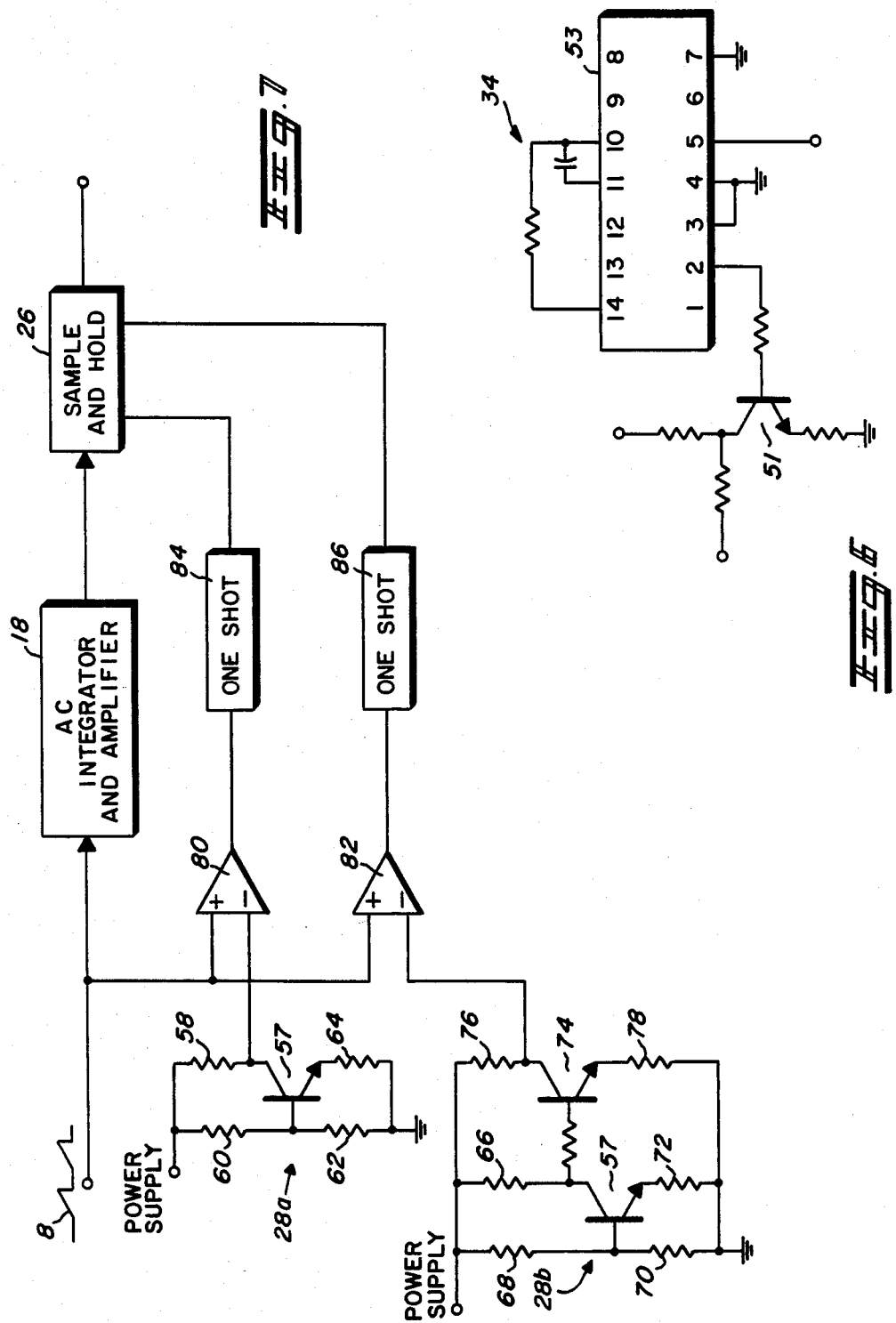

TEMPERATURE COMPENSATION CIRCUIT FOR OSCILLATOR WITH PARABOLIC CHARACTERISTIC

BACKGROUND OF THE INVENTION

This invention relates generally to temperature compensation circuits for oscillator circuits and, more particularly, to temperature compensation circuits for oscillator circuits having frequency responses that are parabolic with respect to temperature.

Many modern electronic circuits require high frequency oscillators which are capable of maintaining extremely stable frequency outputs over broad operating temperature ranges. While in the past it may have been satisfactory to provide oscillators achieving maximum frequencies of up to about 125 MHz at accuracies of about 10 to 100 parts per million or less, today it is often necessary to meet specifications of as low as 1.0 or even 0.1 parts per million at frequencies of 100–500 MHz or more.

Conventionally, uncompensated quartz crystal oscillators are capable of producing the maximum 125 MHz frequencies and 10 ppm accuracies described above, depending upon the cut of the crystal. Surface acoustic wave (SAW) devices can be used in lieu of the quartz crystals to produce the higher frequencies in the range of about 100 MHz to 500 MHz or more, at accuracies comparable to those produced with bulk wave quartz crystals. Compensating circuits, such as that described in U.S. Pat. No. 3,821,665, assigned to the same assignee as the present invention, can then be used to bring accuracy up to the desired 1.0 to 0.1 parts per million level.

Unfortunately, presently available temperature compensating circuits are generally complex and expensive to build and adjust. Many of these circuits produce an extremely undesirable power drain. U.S. Pat. No. 3,821,665, referred to above, describes one excellent temperature compensating circuit which obviates many of the above drawbacks. This circuit, however, is still somewhat complex and expensive since it utilizes a series of multiplying means corresponding to first, second and third order temperature variations generally exhibited by quartz crystals.

Since SAW devices and certain quartz crystals, such as BT cut crystals, exhibit almost purely parabolic frequency shifts with respect to temperature, the invention of a compensation circuit which corrects this type of shift in a simple and straightforward manner would constitute an important contribution to the art.

SUMMARY OF THE INVENTION

The temperature compensation circuit of the present invention utilizes a combination of readily available circuit blocks in a unique configuration to provide a parabolic curve that is the inverse of the parabolic frequency shift of SAW devices and BT cut crystals. This circuit, of course, could be used to compensate any other frequency determining means exhibiting a like parabolic temperature sensitivity.

The temperature compensation circuit of the present invention includes generating means for developing a ramp signal, AC integrator means for converting the ramp signal to single-sided parabolic voltage functions with respect to a time base, and compensation means for converting the parabolic voltage functions to a temperature base, and applying them to the oscillator device.

Conversion of the time-based parabolic functions to a temperature base in order to achieve the desired temperature compensation is accomplished by sampling the parabolic voltage functions at selected times chosen on the basis of the ambient temperature. A voltage variable reactance means such as an EPICAP MMBV3102 varactor available from Motorola, Inc. is coupled between the temperature compensation circuit and the oscillator circuit to actually affect the frequency compensation.

BRIEF DESCRIPTION OF THE DRAWINGS

The features of this invention which are believed to be novel are set forth with particularity in the appended claims. The invention, together with its objects and advantages, may be best understood by reference to the following description, taken in conjunction with the accompanying drawings, in which like reference numerals identify like elements in the several figures and in which:

FIG. 6 is a schematic drawing of an embodiment of a one-shot circuit; and

FIG. 7 is a detailed semi-block/semi-schematic drawing of an improved temperature compensation circuit incorporating the teachings of the present invention for operation at both cold end and hot end temperatures.

BRIEF DESCRIPTION OF THE PREFERRED EMBODIMENT

Figure 1:
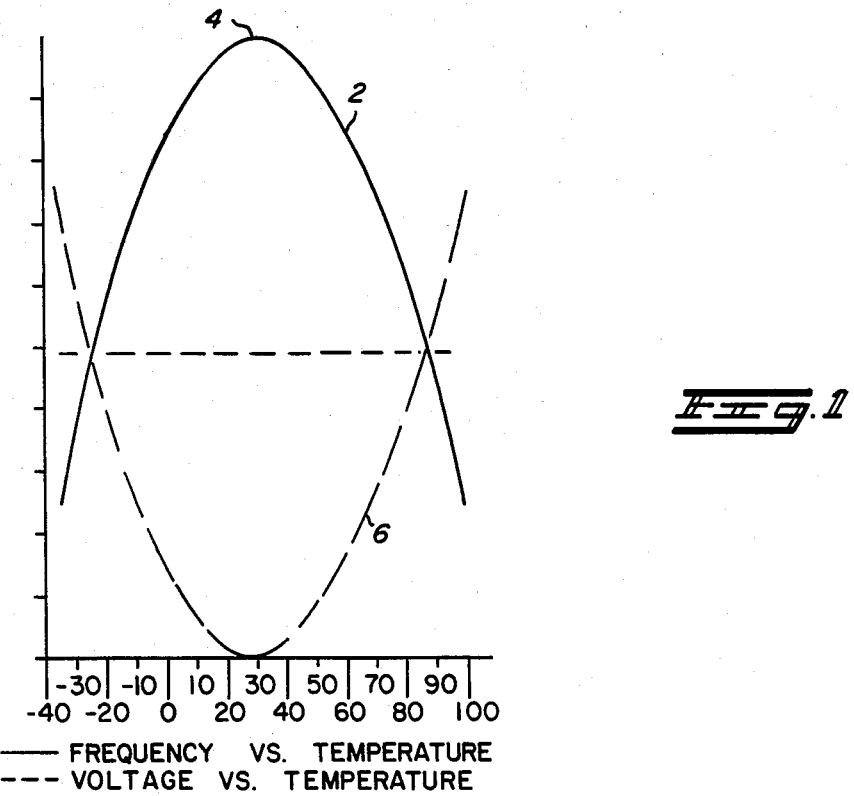
FIG. 1 is a graphical representation of the frequency deviation curve with temperature of a SAW device superimposed over a compensation voltage curve achieved with the circuit of the present invention.

Turning now to FIG. 1, a parabolic curve 2 is shown, representing the frequency variation of a SAW device as a function of temperature. This curve shows that the frequency of the SAW device increases as temperature increases until it reaches the vertex of the curve at 4, which represents the point of maximum frequency deviation or the "turnover temperature" of the SAW device. As the temperature continues to increase past this point, it changes directions and follows the parabolic curve downward. The turnover temperature thus separates the "cold end" of the curve to its left from the "hot end" to its right.

Parabola 6 of FIG. 1 is proportional to the inverse of parabola 2. Parabola 6 represents the compensating voltage produced by the present invention which, when supplied to the voltage variable reactance of the oscillator device, produces a substantially constant frequency output, independent of temperature.

The first step in generating compensating parabola 6 of FIG. 1 entails developing a periodic ramp signal having a linear voltage change with respect to time. This signal is depicted as waveform 8 of FIG. 2. It may be generated in any number of conventional ways, such as with an MC1555 timing circuit, which is available from Motorola, Inc. The amplitude of this signal will be chosen to suit the parameters of the overall circuit.

Figure 2:
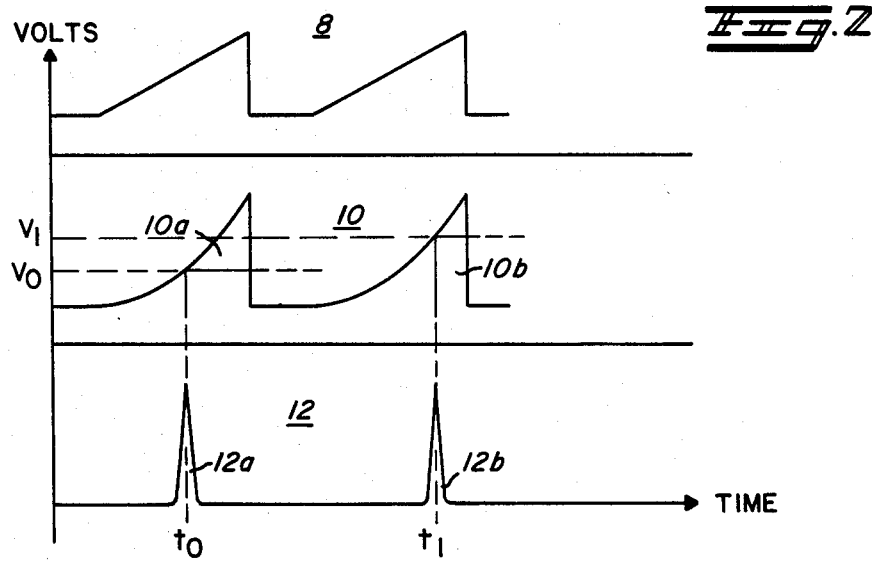
FIG. 2 is a graphical representation of the relationships in time between the ramp signal, the single-sided parabolic voltage functions, and the sampling pulses of the monitoring means of the present invention.

The output of the timing circuit is coupled to an AC integrator to convert waveform 8 to a single-sided parabolic voltage function with respect to a time base, identified as signal 10 in FIG. 2. Since single-sided parabolic voltage signal 10 is a function of time, rather than of temperature, it is necessary to transform this signal to a temperature base in order to compensate the SAW device.

Conversion to a temperature base requires monitoring means for sampling parabolic voltage signal 10 at selected times corresponding to varying ambient temperatures, and providing the selected voltages to a sample and hold circuit to produce a substantially DC level representing the level of the periodic parabolic signal at the time instant of the sampling. Sampling is triggered by sampling signal 12 which comprises a series of pulses occurring at the same frequency as the ramps of signal 8 and the single-sided parabolas of signal 10. The actual circuitry by which these pulses is generated will be discussed below, after examining the time relationship between corresponding signals 10a and 12a at time $t_0$ and 10b and 12b at time $t_1$.

A key to understanding the present invention lies in understanding the time relationship of the sampling of one-sided parabolic signal 10. This relationship may best be understood by beginning in FIG. 2 at $t_0$, which is arbitrarily chosen for discussion purposes to correspond to the ambient temperature. At $t_0$ trigger pulse 12a causes one-sided parabola 10a to be sampled at voltage $v_0$, which is fed to a hold circuit to produce a constant DC level to compensate the SAW device frequency for the deviation at $t_0$. Now, if the ambient temperature increases, the circuitry of the present invention is designed to cause the next trigger pulse $t_1$ to occur at a later time relative to the next single-sided parabola 10b of signal 10 so that a new, higher compensating voltage $v_1$ will be produced to compensate the SAW device deviation at the higher ambient temperature. At both times $t_0$ and $t_1$, the constant DC levels are input to a frequency determining reactive component whose impedance varies linearly with applied bias voltage to compensate the SAW device frequency deviation.

Figure 3:
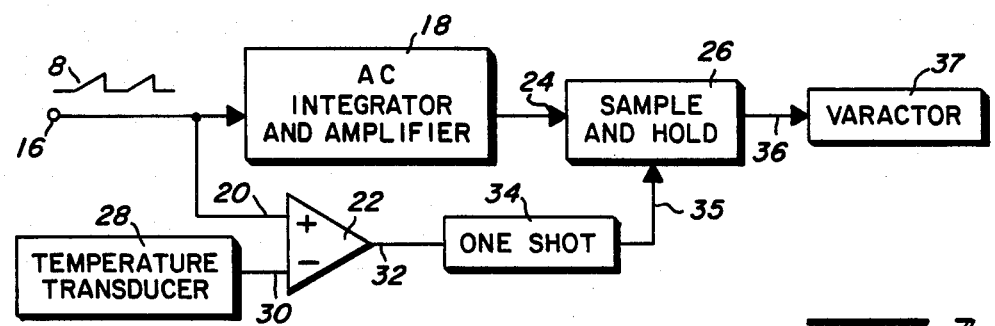
FIG. 3 is a block drawing of an improved temperature compensation circuit according to the teaching of the present invention.

The circuitry and operation of the present invention, as it relates to compensation at the cold end of curve 2 of the SAW device is depicted in the block diagram of FIG. 3, where free-running ramp signal 8 is shown being input at terminal 16. This signal is provided to both the AC integrator and amplifier 18 and the positive terminal 20 of operational amplifier 22.

The signal entering the AC integrator and amplifier 18 is integrated as explained above to produce a periodic one-sided parabolic signal with respect to a time base. This parabolic signal is input at 24 to sample & hold circuit 26 which samples the parabolic signal at selected times corresponding to varying ambient temperatures. Ambient temperatures are measured by a temperature transducer 28 which supplies a voltage indicative of the ambient temperature to operational amplifier 22 at its negative input 30. Temperature transducer 28 may be any conventionally available temperature transducer, such as a transistor for example.

Comparator means is provided in the form of operational amplifier 22 which compares the voltage of transducer 28 to that of ramp signal 8 to produce a pulse at the time instant that the ramp signal exceeds the voltage level of the transducer. Since the output 32 of the operational amplifier 22 remains high as long as the input at 20 is higher than that at 30, a one-shot, 34, is used to provide a short duration trigger pulse to the trigger input 35 of sample and hold circuit 26.

As long as the ambient temperature remains constant, the transducer supplies a constant voltage to the operational amplifier 22 and therefore fixes the time relationship between ramp signal 8 and the trigger pulse to the trigger input 35 of sample and hold circuit 26. The output 36 of sample and hold circuit 26, coupled to varactor 37, therefore remains at a constant DC level. As the ambient temperature decreases, however, the transducer output voltage rises, causing the trigger pulse to occur at a later point in time relative to the one-sided parabolic signal at the sample and hold input 24. This later triggering means that the sampled voltage will be higher on the ramp signal, as discussed earlier in connection with FIG. 2, and that the time-dependent one-sided parabolic signal has therefore been converted to a temperature dependent signal.

Figure 4:
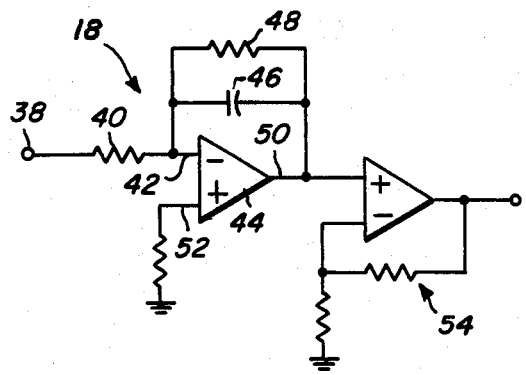
FIG. 4 is a schematic drawing of an embodiment of AC integrator means coupled to non-inverting amplifier means.

One conventional circuit which could be used as integrator and amplifier 18 of FIG. 3 is depicted in FIG. 4. In this figure, the ramp signal 8 is input at a terminal 38, across a resistor 40 to the negative input 42 of an operational amplifier 44. The signal at 42 is also supplied to an RC circuit comprising capacitor 46 and resistor 48 which in turn are coupled to the output 50 of operational amplifier 44. The positive terminal 52 of operational amplifier 50 is grounded as shown. The output at 50 is equal to the integral of the input at 38 multiplied by a constant dependent upon the values of capacitor 46 and resistor 48. Integral output 50 is supplied to a conventional non-inverting operational amplifier circuit 54 which acts primarily to adjust the magnitude of the one-sided parabolic signal 10 in FIG. 2 according to the desired proportional relationship between curves 2 and 6 in FIG. 1.

Figure 5:
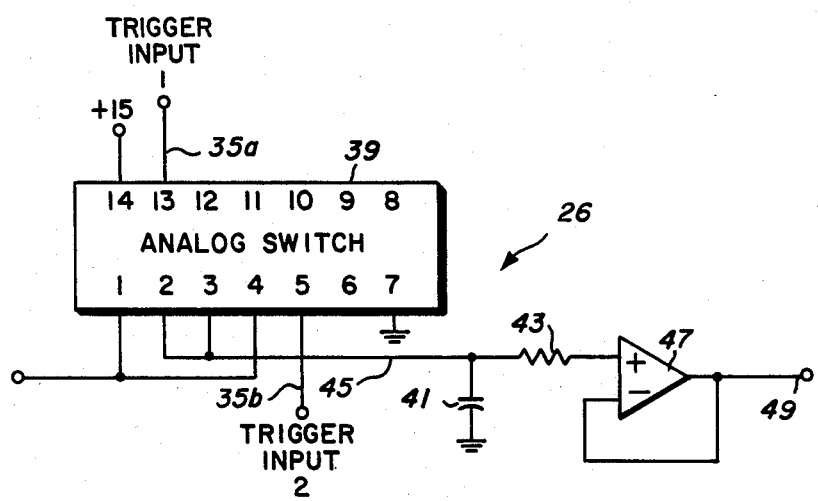
FIG. 5 is a schematic drawing of an embodiment of a sample and hold circuit.

A circuit which could be utilized as sample and hold 26 of FIG. 3 is depicted in FIG. 5. This circuit utilizes a CMOS dual in-line integrated circuit analog switch 39, such as an MC14066 available from Motorola, Inc., arranged as shown in FIG. 5 with capacitor 41 and resistor 43 chosen to minimize decay on the switch output 45 with load on the circuit. An operational amplifier 47 is also arranged as a voltage follower to isolate the circuit output 49 from the analog switch. Trigger Input 1 35a and 2 35b of this circuit are utilized for cold end and hot end operation of the overall compensation circuit as described below in connection with FIG. 7.

A simple and efficient circuit for providing the one-shot 34 as shown in FIG. 3 is depicted schematically in FIG. 6. This circuit utilizes a dual in-line integrated circuit TTL 74121, as shown at 53, which is readily available from Motorola, Inc., Texas Instruments and others. A general purpose transistor 51 is used in this circuit to achieve the 15 volt levels required for triggering the CMOS analog switch 39 of sample and hold circuit 26 (see FIG. 5).

Although the discussion above relates only to compensation of the SAW device at cold end temperatures, the addition of compensation at hot end temperatures is a simple matter. FIG. 7 illustrates a compensation circuit according to the teaching of the present invention in which SAW device frequency shifts for both cold end and hot end temperatures are compensated. Comparing this circuit to that of FIG. 3, it is noted that ramp signal 8, AC integrator and amplifier 18, and sample and hold 26 of FIG. 3 are utilized.

Temperature transducer 28 of FIG. 3 is, however, replaced here by two temperature transducer circuits, circuit 28a for cold end compensation and circuit 28b for hot end compensation. Both of these circuits relay upon the temperature sensitivity of the pn junction of a general purpose transistor 57 which has a slope of 2 mV per degree Centigrade. Resistors 58-72 are chosen in these circuits to give amplification sufficient to insure that triggering will occur across substantially the entire compensation signal for both hot end and cold end compensation, providing a single value at the turnover temperature. In addition, circuit 28b includes a unity gain common emitter transistor 74 with resistors 76 and 78 being of like value, to invert the compensation slope of the transducer for hot end compensation.

While alternative temperature transducer designs could be used in the practice of the present invention, the above design utilizing two independent transducer circuits is presently preferred. In this arrangement, the outputs of temperature transducers 28a and 28b are coupled independently to operational amplifiers 80 and 82 and corresponding one shot circuits 84 and 86. The operation of these op amps and one shot circuits, however, corresponds precisely to the operation of op amp 22 and one shot circuit 34 of FIG. 3, except that one shot circuit 84 is coupled to trigger 1 of analog switch 39 of the sample and hold circuit 26 while one shot circuit 86 is coupled to trigger 2 of the analog switch.

The compensation circuit of the present invention is capable of compensating SAW devices, BT crystals and other oscillator circuits exhibiting frequency responses that are parabolic with respect to temperature with great accuracy and economy. It is a highly flexible circuit capable of fine adjustment to accommodate many different combinations of sawtooth frequency, integrator RC values, amplifier and temperature transducer circuits.

It will be understood that the invention may be embodied in other specific forms without departing from the spirit or central characteristics thereof. The present embodiments are to be considered as being illustrative and not as being restrictive, and the invention is not to be limited to the details herein but may be modified within the scope of the appended claims.

What is claimed is:

1. An improved temperature compensation circuit for an oscillator circuit having a frequency response that is parabolic with respect to temperature, comprising:
   generating means for developing a periodic ramp signal having a linear voltage change with respect to time;
   AC integrator means for converting said periodic ramp signal to a periodic single sided parabolic voltage function with respect to a time base; and
   compensation means for converting said periodic parabolic voltage function with respect to a time base to a voltage function with respect to a temperature base and applying said converted voltage function to a voltage variable reactance to correct frequency deviations due to variations in the ambient temperature in which said oscillator circuit is operating.

2. An improved temperature compensation circuit as in claim 1 and said oscillator circuit comprising a surface acoustic wave device.

3. An improved temperature compensation circuit as in claim 1, and said oscillator circuit comprising a BT cut quartz crystal.

4. An improved temperature compensation circuit as in claim 1 wherein said compensation means includes monitoring means for sampling said periodic parabolic voltage function with respect to a time base at selected times corresponding to ambient temperatures to produce said converted voltage function.

5. An improved temperature compensation circuit as in claim 4 including holding means, responsive to each sampling of said periodic parabolic voltage functions with respect to a time base, for maintaining said converted voltage function at a substantially constant level until the next sampling.

6. An improved temperature compensation circuit as in claim 4 wherein said compensation means further includes:
   transducer means for supplying a voltage indicative of the ambient temperature; and
   comparator means, coupled to said generating means and to said transducer means, for comparing the voltage level of said periodic ramp signal to said voltage indicative of the ambient temperature, said comparator means triggering said monitoring means when the instantaneous voltage level of said periodic ramp signal exceeds said instantaneous voltage indicative of the ambient temperature.

7. An improved temperature compensation circuit as in claim 6 wherein said transducer means includes positive transducer means for supplying a positively sloping compensation signal in response to changing ambient temperatures in a first temperature range and negative transducer means for supplying a negatively sloping compensation signal in response to changing ambient temperatures in a second temperature range and said comparator means coupled to each of said positive and negative transducer means.

8. An improved temperature compensation circuit as in claim 1 including reactance means for varying the frequency of the oscillator circuit in response to said converted voltage function.

9. An improved temperature compensation circuit for an oscillator circuit having a frequency response that is parabolic with respect to temperature, comprising:
   generating means for developing a periodic ramp signal having a linear voltage change with respect to time;
   AC integrator means for converting said periodic ramp signal to a single sided periodic parabolic voltage function with respect to a time base;
   transducer means for supplying a voltage indicative of the ambient temperature;
   comparator means, coupled to said generating means and to said transducer means, for comparing the instantaneous voltage level of said periodic ramp signal to said instantaneous voltage indicative of the ambient temperature;
   monitoring means, coupled to said comparator means, for sampling said periodic parabolic function with respect to a time base when the instantaneous voltage level of said periodic ramp signal exceeds said instantaneous voltage indicative of the ambient temperature; and
   holding means, responsive to each sampling of said periodic parabolic voltage function with respect to a time base, connected to a voltage variable reactance, for maintaining a voltage function with respect to a temperature base at a substantially constant level until the next sampling thereby compensating said oscillator circuit.

10. A method for temperature compensating an oscillator circuit having a frequency response that is parabolic with respect to temperature, comprising:

generating a ramp signal having a linear voltage change with respect to time;

integrating said ramp signal to produce single-sided parabolic voltage functions with respect to a time base;

sampling said parabolic voltage functions at selected times corresponding to varying ambient temperatures to produce compensating voltages; and varying the frequency of said oscillator circuit in response to said compensating voltages.

* * * * *